US006798240B1

(12) United States Patent
Pedersen

(10) Patent No.: US 6,798,240 B1
(45) Date of Patent: Sep. 28, 2004

(54) LOGIC CIRCUITRY WITH SHARED LOOKUP TABLE

(75) Inventor: Bruce Pedersen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/351,026

(22) Filed: Jan. 24, 2003

(51) Int. Cl.[7] .................................................. G06F 7/38
(52) U.S. Cl. ......................................... 326/39; 326/41
(58) Field of Search ............................... 326/37, 38, 39, 326/40, 41, 47, 49, 101

(56) References Cited

U.S. PATENT DOCUMENTS

| | | |
|---|---|---|
| 5,260,610 A | 11/1993 | Pedersen et al. |
| 5,260,611 A | 11/1993 | Cliff et al. |
| 5,274,581 A | 12/1993 | Cliff et al. |
| 5,295,090 A | 3/1994 | Hsieh et al. |
| 5,349,250 A | 9/1994 | New |
| 5,359,242 A | 10/1994 | Veenstra |
| 5,359,468 A | 10/1994 | Rhodes et al. |
| 5,365,125 A | 11/1994 | Goetting et al. |
| 5,436,575 A | 7/1995 | Pedersen et al. |
| 5,481,206 A | 1/1996 | New et al. |
| 5,481,486 A | 1/1996 | Cliff et al. |
| 5,483,478 A | 1/1996 | Chiang |
| 5,485,103 A | 1/1996 | Pedersen et al. |
| 5,488,316 A | 1/1996 | Freeman et al. |

(List continued on next page.)

OTHER PUBLICATIONS

E. Ahmed et al., "The Effect of LUT and Cluster Size on Deep–Submicron FPGA Performance and Density", FPGA '2000 Monterey Ca, pp. 3–12.

D. Cherepacha et al., "DP–FPGA: An FPGA Architecture Optimized for Datapaths", VLSI Design 1996, vol. 4, No. 4, pp. 329–343.

S. Kaptanoglu et al., "A new high density and very low cost reprogrammable FPGA architecture", FPGA 99 Monterey Ca, pp. 3–12.

J. Rose et al., "Architecture of Field–Programmable Gate Arrays: The Effect of Logic Block Functionality on Area Efficiency", J. of Solid–State circuits, vol. 25, No. 5, Oct. 1990, pp. 1217–1224.

J. L. Kouloheris et al., "FPGA Area versus Cell Granularity–Lookup Tables and PLA Cells", FPGA '92, pp. 9–14.

"FLEX 8000 Programmable Logic Device Family", Altera Corp. Jun. 1999, ver. 10.01, pp. 349–364.

"FLEX 10K Embedded Programmable Logic Device Family", Altera Corp. Mar. 2001, ver. 4.1, pp. 1–28.

"FLEX 6000 Programmable Logic Device Family", Altera Corp., Mar. 2001, ver. 4.1, pp. 1–17.

"Mercury Programmable Logic Device Family", Altera Corp., Mar. 2002, ver. 2.0, pp. 1–34.

"APEX 20K Programmable Logic Device Family", Altera Corp., Feb. 2002, ver. 4.3, pp. 1–29.

"Virtex™—II Platform FPGAS: Detailed Description", XILINX, Advance Product Specification, v2.1.1, Dec. 6, 2002, 40 pgs.

"Stratix FPGA Family Data Sheet", Altera Corp., Dec. 2002, Preliminary Information, pp. 11–19.

"ORCA® Series 2 Field–Programmable Gate Arrays", Data Sheet, Lattice Semiconductor Corp., Jan. 2003, 26 pgs.

*Primary Examiner*—Michael Tokar
*Assistant Examiner*—Linh V Nguyen
(74) *Attorney, Agent, or Firm*—Morrison & Foerster LLP

(57) ABSTRACT

A particular embodiment of the present invention provides a shared-LUT logic circuit that provides the functionality of two (n+1)LUT logic circuits without requiring approximately twice the sources of two nLUT circuits. In some embodiments, a shared-LUT logic circuit is provided that can be configured to operate in multiple modes including, for example, an nLUT mode, an (n+1)LUT mode, and other modes.

35 Claims, 7 Drawing Sheets

U.S. PATENT DOCUMENTS

| | | | |
|---|---|---|---|
| 5,500,608 A | | 3/1996 | Goetting et al. |
| 5,523,963 A | | 6/1996 | Hsieh et al. |
| 5,546,018 A | | 8/1996 | New et al. |
| 5,629,886 A | | 5/1997 | New |
| 5,631,576 A | | 5/1997 | Lee et al. |
| 5,672,985 A | | 9/1997 | Lee |
| 5,675,262 A | | 10/1997 | Duong et al. |
| 5,724,276 A | | 3/1998 | Rose et al. |
| 5,761,099 A | | 6/1998 | Pedersen |
| 5,818,255 A | | 10/1998 | New et al. |
| 5,825,662 A | * | 10/1998 | Trimberger ............... 716/3 |
| 5,889,411 A | | 3/1999 | Chaudhary |
| 5,898,318 A | * | 4/1999 | Pedersen ............... 326/39 |
| 5,898,319 A | | 4/1999 | New |
| 5,898,602 A | | 4/1999 | Rothman et al. |
| 5,905,385 A | * | 5/1999 | Sharpe-Geisler ......... 326/39 |
| 5,909,126 A | | 6/1999 | Cliff et al. |
| 5,920,202 A | | 7/1999 | Young et al. |
| 5,926,036 A | | 7/1999 | Cliff et al. |
| 5,999,016 A | | 12/1999 | McClintock et al. |
| 6,021,423 A | | 2/2000 | Nag et al. |
| 6,051,992 A | | 4/2000 | Young et al. |
| 6,107,827 A | | 8/2000 | Young et al. |
| 6,118,300 A | | 9/2000 | Wittig et al. |
| 6,154,052 A | | 11/2000 | New |
| 6,154,053 A | | 11/2000 | New |
| 6,154,055 A | | 11/2000 | Cliff et al. |
| 6,157,209 A | | 12/2000 | McGettigan |
| 6,184,707 B1 | * | 2/2001 | Norman et al. ........... 326/39 |
| 6,191,610 B1 | | 2/2001 | Wittig et al. |
| 6,191,611 B1 | | 2/2001 | Altaf |
| 6,201,408 B1 | * | 3/2001 | Skahill et al. ........... 326/39 |
| 6,288,568 B1 | | 9/2001 | Bauer et al. |
| 6,288,570 B1 | | 9/2001 | New |
| 6,297,665 B1 | | 10/2001 | Bauer et al. |
| 6,323,682 B1 | | 11/2001 | Bauer et al. |
| 6,400,180 B2 | | 6/2002 | Wittig et al. |
| 6,501,296 B2 | * | 12/2002 | Wittig et al. ............. 326/39 |
| 6,744,278 B1 | * | 6/2004 | Liu et al. ................. 326/41 |

\* cited by examiner

LOGIC CIRCUITRY WITH SHARED LOOKUP TABLE

BACKGROUND OF THE INVENTION

The present invention relates to logic elements for use with programmable logic devices or other similar devices.

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a look-up table (LUT) or product term, carry-out chain, register, and other elements.

Logic elements, including look-up table (LUT)-based logic elements, typically include configurable elements holding configuration data that determines the particular function or functions carried out by the logic element. A typical LUT circuit may include ram bits that hold data (a "1" or "0"). However, other types of configurable elements may be used. Some examples may include static or dynamic random access memory, electrically erasable read-only memory, flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "memory element" will be used to refer to any programmable element that may be configured to determine functions implemented by a PLD.

A typical LUT circuit used as a logic element provides an output signal that is a function of multiple input signals. The particular logic function may be determined by programming the LUT's memory elements. As will be explained further herein (see FIG. 1 and accompanying text), a typical LUT circuit may be represented as a plurality of memory elements coupled to a "tree" of 2:1 muxes. The LUT mux tree includes a first level comprising a single 2:1 mux providing the LUT output and also includes successive additional levels of muxes, each level including twice as many muxes as the previous level and the number of memory elements being twice as many as the number of 2:1 muxes in a last mux level coupled to the memory elements. Each 2:1 mux level provides a logic input to the LUT circuit coupled to control inputs of the muxes at that mux level. Thus, to obtain an n-input LUT (or "nLUT") typically requires $2^n$ memory elements and $2^n$ muxes. Adding an input to an nLUT circuit to provide an n+1 input LUT ("(n+1) LUT") therefore typically requires providing a total of $2^{n+1}$ memory elements and $(2^{n+1}-1)$muxes, i.e., approximately a doubling of resources relative to that required by an nLUT.

For many applications, the functions that need to be implemented by a first LUT circuit and a second LUT circuit are identical. Also, for some applications, it may be possible for inputs of first and second LUT circuits to be shared without reducing the functionality required by the application. In such instances, there are opportunities that need to be maximized for sharing resources to reduce the total number of memory elements and muxes that would otherwise be required.

In other instances, while also minimizing resources, it is useful to have the flexibility to switch between two nLUT circuits that maybe independently programmed to implement n-input functions and two (n+1)LUT circuits that can be programmed to implement the same n+1-input functions. It may also be desirable to, with minimal added resources, also have the added flexibility to select an additional option such as, for example, two LUT circuits that can implement at least some functions of n+2 inputs.

SUMMARY OF THE INVENTION

One embodiment of the present invention provides a shared-LUT logic circuit that provides the functionality of two (n+1)LUT logic circuits without requiring twice the resources of two nLUT circuits. Another embodiment of the present invention provides a shared-LUT logic circuit that may be configured to provide either the functionality of two nLUT circuits that may be independently programmed to provide n-input functions or the functionality of two (n+1) LUT circuits that may be programmed to provide the same n+1-input functions. Another embodiment of the present invention provides a shared-LUT logic circuit that may be configured to provide one of the following: (i) two nLUT circuits that may be programmed to provide independent n-input functions; (ii) two (n+1)LUT circuits that may be programmed to provide the same n+1-input functions; or (iii) two (n+2)LUT circuits that may be programmed to provide limited related n+2-input functions. In these and other illustrated embodiments, a plurality of muxes is interposed between an x and an x+1 mux level of first and second nLUT circuitry to implement sharing of at least some of the nLUT circuitry, thereby providing first and second (n+1) LUT circuits and variations thereon. In yet another embodiment, a plurality of muxes is interposed between a last mux level and memory elements of first and second nLUT circuitry to provide two (n+1)LUT circuits that do not require shared inputs and may be programmed to provide two independent n+1-input functions.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION OF THE EXEMPLARY EMBODIMENTS

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1A:
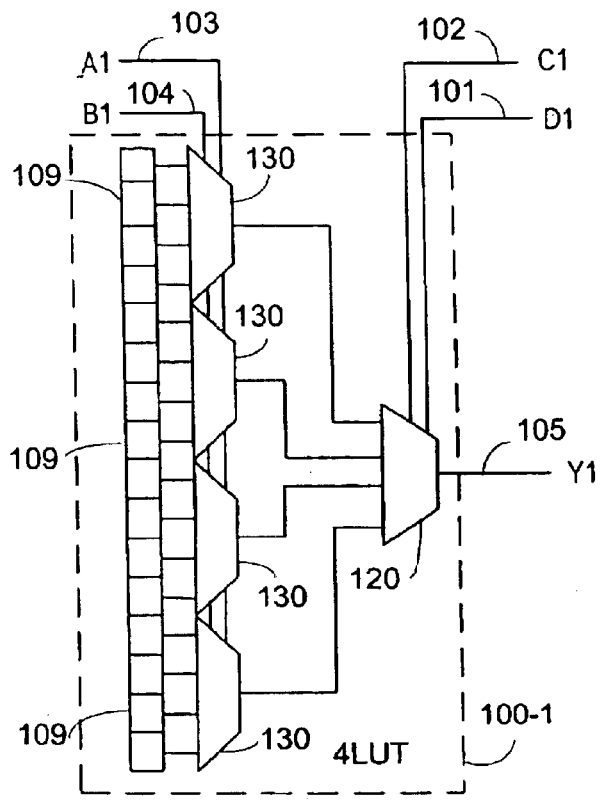
FIGS. 1a and 1b illustrates two four-input lookup table circuits ("4LUTs") of a type modified and coupled to implement the embodiment of the invention illustrated in FIG. 2.
Figure 1C:
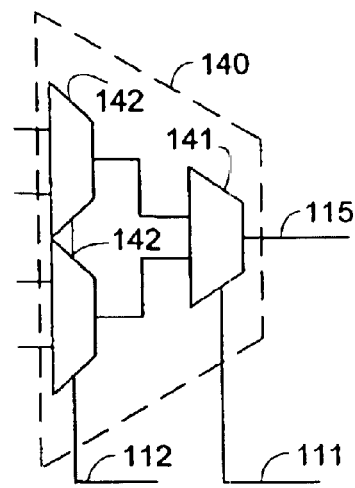
FIG. 1c illustrates the 2:1 muxes that make up a 4:1 mux of the 4LUT illustrated in FIG. 1b.
Figure 1B:
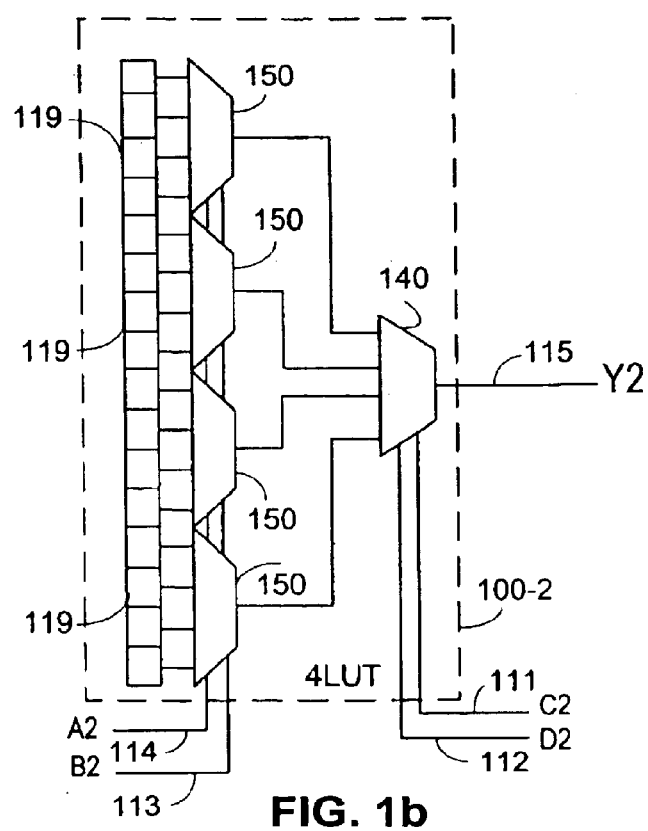

FIGS. 1a and 1b illustrate two four-input lookup-table circuits ("4LUTs") 100-1 and 100-2. The design of the embodiment of the invention illustrated and described in FIG. 2 and accompanying text may be understood as a modification and coupling of two 4LUTs such as 4LUTs 100-1 and 100-2 (or more generally as the modification and coupling of two n-input LUT circuits). Thus, an understanding of certain aspects of the structure of a LUT circuit is helpful to understanding the various embodiments of the invention illustrated in other figures herein. 4LUTs 100-1 and 100-2 are typical LUT circuits. 4LUT 101-1 comprises memory elements 109, 4:1 muxes 130, and 4:1 mux 120. Each memory element 109 can hold a data bit (1 or 0) and each is coupled to provide that bit to an input of a mux 130 as shown. Two control inputs of each mux 130 are coupled to, respectively, an input 104 and an input 103 of 4LUT 100-1 as shown. The output of each mux 130 is coupled to an input of mux 120 as shown. Two control inputs of mux 120 are coupled to, respectively, an input 102 and an input 101 of 4LUT 100-1 as shown. The output of mux 120 is coupled to provide output 105 of 4LUT 100-1.

Those skilled in the art will appreciate that a 4LUT such as 4LUT 100-1 can provide a complete function of four input signals. "Complete" in this context simply means that programming of memory elements 109 may be used to configure 4LUT 100-1 to perform any four-input function. E.g., 4LUT 100-1 may be configured (by programming its memory elements, e.g., loading values into those elements) so that the signal Y1 at output 105 is any one of a full range of logical functions of signals B1, A1, C1 and D1 provided at, respectively, inputs 104, 103, 102, 101 as will be appreciated by those skilled in the art.

4LUT 100-2 is comparable to 4LUT 100-1. 4LUT 100-2 comprises memory elements 119, muxes 150, mux 140, connected as shown. Similar to 4LUT 100-1, 4LUT 100-2 can also implement four-input functions. The signal Y2 at output 115 is a function of four input signals, A2, B2, C2, and D2 provided at respective inputs 114, 113, 112, and 111.

Figure 4:
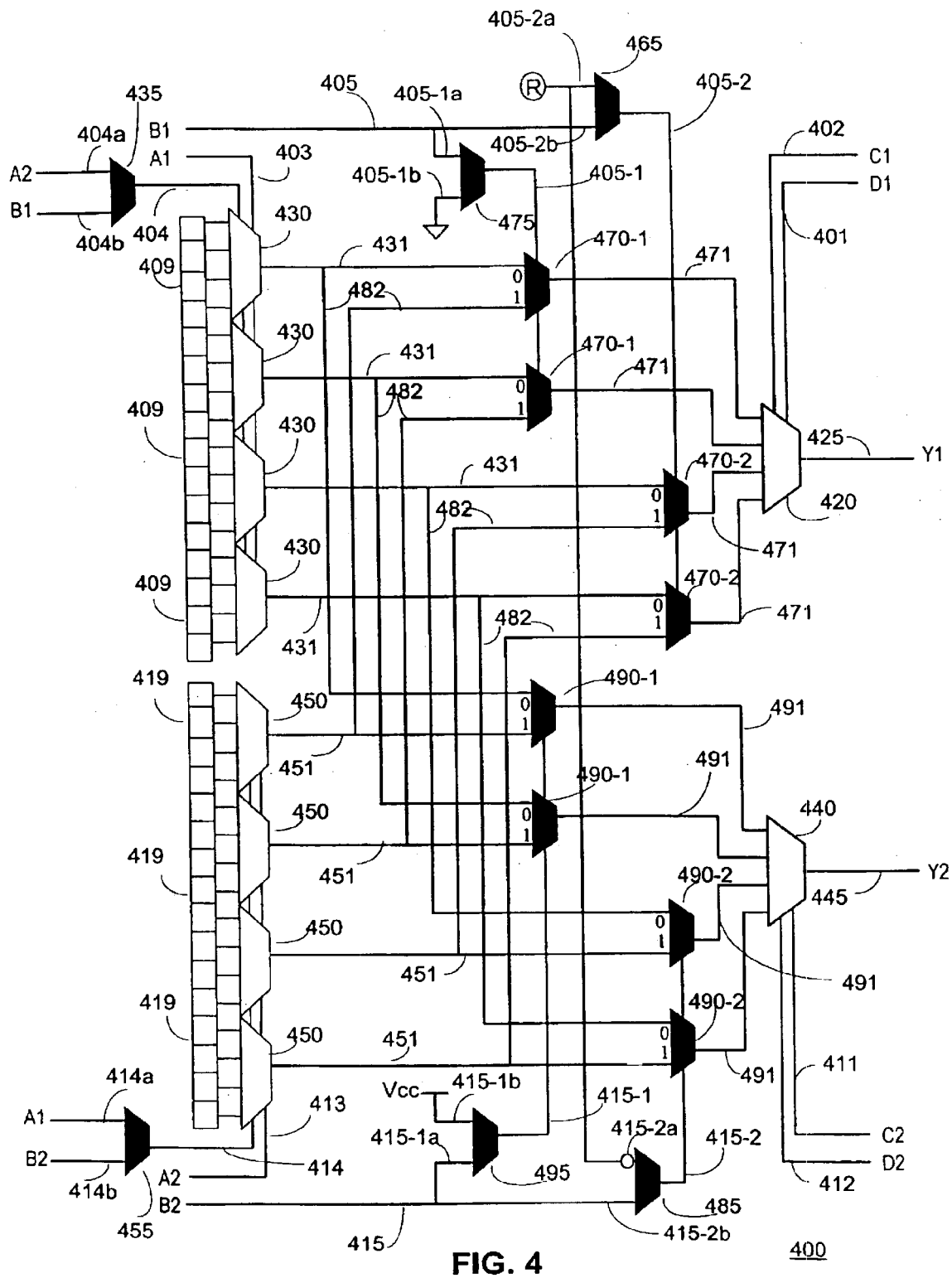
FIG. 4 illustrates first and second 4LUT logic circuitry coupled by interposed muxes and including other additional muxes that may be programmed to selectively provide: (i) two 4LUT logic circuits (ii) two 5LUT logic circuits or (iii) two 6LUT logic circuits in accordance with another embodiment of the present invention.

FIG. 1c illustrates the "tree" of 2:1 muxes that make up 4:1 mux 140. As one skilled in the art will appreciate, a typical LUT circuit has a mux tree that may be referenced by "levels" of 2:1 muxes provided relative to the LUT circuit's output. 4:1 muxes, such as muxes 150 and mux 140 can be understood as "tree" of three 2:1 muxes. (Note, as will be appreciated by those skilled in the art, the "tree" of 2:1 muxes making up 4:1 muxes 140 or 150 are part of the larger 2:1 mux tree of LUTs 100-1 or 100-2). For example, as illustrated in FIG. 1c, 4:1 mux 140 may be represented by three 2:1 muxes including two muxes 142 and mux 141 connected as shown. Control inputs of muxes 142 are connected to LUT 100-2 input 112. An output of each mux 142 is coupled to an input of mux 141 as shown. A control input of mux 141 is connected to input 111 of LUT 100-2. The output of mux 141 provides the output 115 of LUT 100-2. Thus, relative to output 115, 4:1 mux 140 includes muxes at two "levels" of 2:1 muxes. Mux 141 may be referenced as in a first level and muxes 142 may be referenced as in a second level of the overall tree of muxes included in LUT 100-2. As will be appreciated by those skilled in the art, a 4:1 mux may be implemented in a manner other than mux 140's "tree" of three 2:1 muxes. For example, a 4:1 mux might be implemented by four pass gates with each of the pass gates being controlled by the decoded output of two control signals. In such an example, the four pass gates themselves would not be differentiated by level relative to each other, however, the 4:1 mux would effectively implement two levels of 2:1 muxing.

In general, a typical LUT circuit's mux tree will have a level of 2:1 muxes coupled to each LUT input. For example, there are four levels of 2:1 muxes in each of 4LUT 100-1 and 100-2. In further detail, for example, considering 4LUT 100-2 and assuming 4:1 muxes 150 have a similar internal structure to mux 140, a third level of 4LUT 100-2's mux tree has four 2:1 muxes (one for each mux 150) with control inputs coupled to logic input 113, and a fourth level of 4LUT 100-2's mux tree has eight 2:1 muxes (two for each mux 150) with control inputs coupled to logic input 114.

Figure 2:
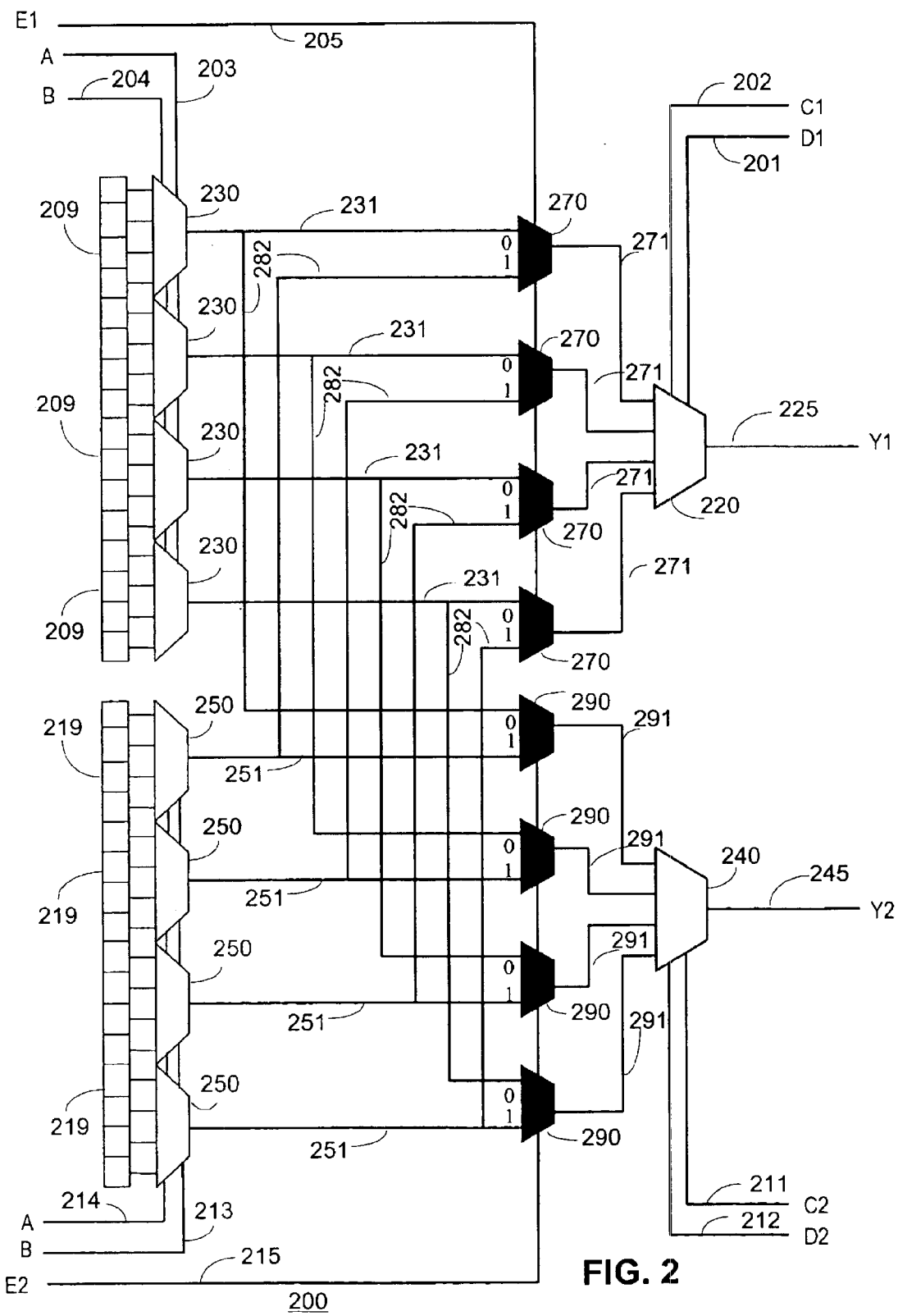
FIG. 2 illustrates first and second 4LUT logic circuitry coupled by interposed muxes to provide two 5LUT logic circuits in accordance with an embodiment of the present invention.

FIG. 2 illustrates logic circuit 200 in accordance with an embodiment of the present invention. Circuit 200 includes the circuitry of two 4LUT circuits plus additional circuitry including a plurality of muxes interposed between two mux levels of the 4LUT circuits and coupled so that some of the circuitry of the two 4LUT circuits is shared in logic circuit 200. Additional logic inputs are provided coupled to control inputs of the interposed muxes as will now be described.

First 4LUT circuitry (or, stated more generally, first "nLUT" circuitry where, in this example, n=4) includes memory elements 209, muxes 230, lines 231 and 271, and mux 220. Control inputs of mux 220 are coupled to, respectively, first and second inputs 201 and 202. Control inputs of muxes 230 are coupled to, respectively, third and fourth inputs 203 and 204. The output of mux 220 is coupled to provide output signal Y1 at output 225.

Second 4LUT circuitry (or, second "nLUT" circuitry where n=4) includes memory elements 219, muxes 250, lines 251, lines 291, and mux 240. Control inputs of mux 240 are coupled to, respectively, first and second inputs 211 and 212. Control inputs of muxes 250 are coupled to, respectively, third and fourth inputs 213 and 214. The output of mux 240 is coupled to provide output 245.

Relative to output 225, input 202 may be said to be coupled to control mux inputs at a second level of a mux tree of first 4LUT circuitry. Input 203 may be said to be coupled to control inputs of muxes at a third mux level of first 4LUT circuitry. Similarly, relative to output 245, input 212 may be said to be coupled to control inputs of muxes at a second mux level of second 4LUT circuitry. Input 213 may be said to be coupled to control inputs of muxes at a third mux level of second 4LUT circuitry.

Additional circuitry includes muxes 270, muxes 290, and lines 282. Relative to the mux levels of first and second 4LUT circuitry, a plurality of muxes including muxes 270 and 290 are interposed between a second and third mux level (more generally, these muxes may be said to be interposed between an "x" and an "x+1" mux level). Outputs of muxes 230 are respectively coupled to respective first inputs (labeled "0") of muxes 270 via respective lines 231 and to respective first inputs of muxes 290 via respective lines 282 as shown. Outputs of muxes 250 are respectively coupled to respective second inputs (labeled "1") of muxes 290 via respective lines 251 and to respective second inputs of muxes 270 via respective lines 282 as shown. Outputs of muxes 270 are respectively coupled to a respective input of mux 220 via respective lines 271 and outputs of muxes 290 are respectively coupled to a respective input of mux 240 via respective lines 291 as shown.

Control inputs of muxes 270 are coupled to a first additional input 205. Control inputs of muxes 290 are coupled to a second additional input 215. More generally, additional inputs 205 and 215 may be said to be "n+1th" inputs of respective (n+1)LUT circuitry provided by logic circuit 200.

In the embodiment illustrated in FIG. 2, two inputs are shared across each half of the logic circuitry 200. In particular, inputs 203 and 214 are coupled to both receive the same signal A; also, inputs 204 and 213 are coupled to receive the same signal B. The remaining inputs are not shared. Thus, signals C1, D1, and E1 are received at, respectively, inputs 202, 201, and 205. Similarly, signals C2, D2, and E2 are received at, respectively, inputs 211, 212, and 215. In the illustrated embodiment, logic circuitry 200 provides the functional equivalent of two 5LUT logic circuits. A first 5LUT ((n+1)LUT) circuit provides signal Y1 which is a function of input signals A, B, C1, D1, and E1. A second 5LUT circuit provides signal Y2 which is a function of input signals A, B, C2, D2, and E2. The five-input functions implemented by logic circuit 200 may be reconfigured by loading different bits into memory elements 209 and memory elements 219. In this embodiment, each 5LUT may be programmed to implement the same logical function of the five indicated input signals. The phrase "same logical function" is meant herein to be at least broad enough that two logical functions may be "the same" if one is a larger function that can be transformed into a smaller function by tying certain inputs to Vcc, ground, or one of the other inputs. In other words, an n-input function might be made the "same" as an (n–m)-input function by tying m of its inputs to VCC, GND, or to one of the remaining (n–m) inputs. For example, the 5-input function (A&B&C&D&E) can be made the "same" as the 4-input function (A&B&C&D) by tying input "E" to VCC. Likewise, the 5-input function (A&B&C&D&E#!A&!B&!C&!D&!E) (where "&" is the logical "AND" operator, "#" is the logical "OR" operator, and "!" is the logical "NOT" operator) can be made the "same" as the 4-input function (A&B&C&D#!A&!B&!C&!D) by tying, e.g., "E" to the same input as "D".

In the illustrated embodiment a full range of logical functions of five inputs may be implemented. In one alternative to the embodiment illustrated in FIG. 2, logic circuitry 200 might be modified so that, for example, two inputs were not shared across the two halves of the circuit and different signals would be provided to inputs 203 and 214 (for example a signal A1 and A2 respectively) and different signals would also be provided to inputs 204 and 213 (for example, a signal B1 and B2 respectively). As those skilled in the art would appreciate, such an alternative would permit shared-LUT circuitry in which each output was an incomplete function of seven inputs. For example, in such a modification of logic circuitry 200, a signal Y1 would be a function of input signals A1 (at input 204), B1 (at input 203), C1 (at input 202), D1 (at input 201), E1 (at input 205), A2 (at input 214), and B2 (at input 213) and a signal Y2 would be a function of input signals A2 (at input 214), B2 (at input 213), C2 (at input 211), D2 (at input 212), A1 (at input 204) and B1 (at input 203). Such a modified embodiment would provide incomplete functions of seven inputs; i.e., it could be programmed to implement some, but not a full range of seven-input functions.

Figure 3:
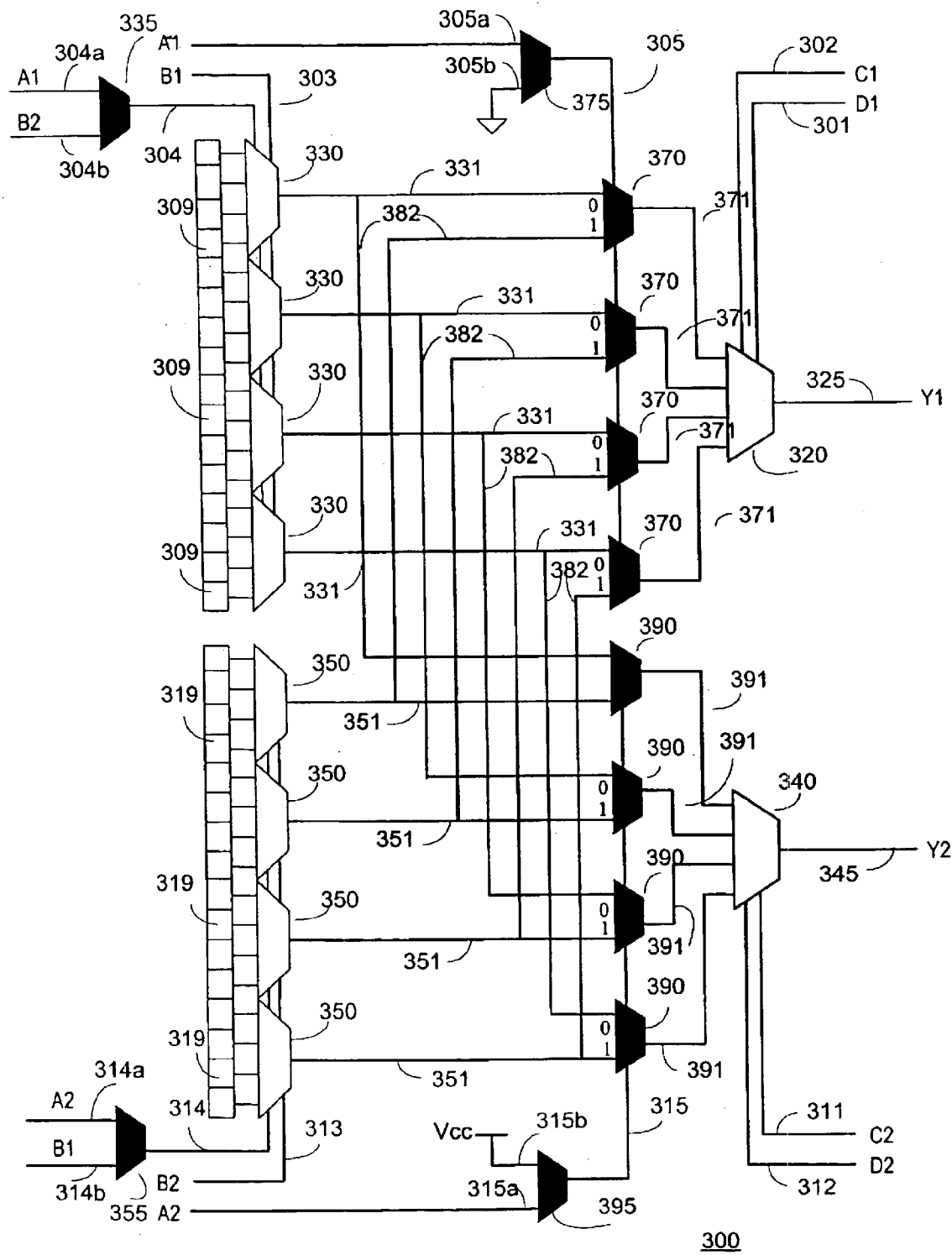
FIG. 3 illustrates first and second 4LUT logic circuitry coupled by interposed muxes and also including other additional muxes that may be programmed to selectively provide either two 5LUT logic circuits or two 4LUT logic circuits in accordance with another embodiment of the present invention.

FIG. 3 illustrates logic circuit 300 in accordance with another embodiment of the present invention. Circuit 300 includes the circuitry of two 4LUT circuits and includes additional circuitry including a plurality of muxes interposed between two mux levels of the 4LUT circuits and coupled so that some of the circuitry of the two 4LUT circuits is shared in logic circuitry 300. Additional logic inputs are provided coupled to control inputs of the interposed muxes. Furthermore, additional muxes in front of certain of the logic inputs allow logic circuit 300 to provide, depending on configuration, functionality of either two 4LUT circuits which may or may not implement the same function, or two 5LUT circuits which implement the same function. These aspects will now be described in further detail.

First 4LUT circuitry includes memory elements 309, muxes 330, lines 331 and 371, and mux 320. Control inputs of mux 320 are coupled to, respectively, first and second inputs 301 and 302. Control inputs of muxes 330 are coupled to, respectively, third and fourth inputs 303 and 304. The output of mux 320 is coupled to provide output signal Y1 at output 325.

Second 4LUT circuitry includes memory elements 319, muxes 350, lines 351, lines 391, and mux 340. Control inputs of mux 340 are coupled to, respectively, first and second inputs 311 and 312. Control inputs of muxes 350 are coupled to, respectively, third and fourth inputs 313 and 314. The output of mux 340 is coupled to provide output 345.

Relative to output 325, input 302 may be said to be coupled to control inputs of muxes at a second mux level of first 4LUT circuitry. Input 303 may be said to be coupled to control inputs of muxes at a third mux level of first 4LUT circuitry. Similarly, relative to output 345, input 312 may be said to be coupled to control inputs of muxes at a second mux level of second 4LUT circuitry. Input 313 may be said to be coupled to control mux inputs at a third level of a mux tree of second 4LUT circuitry.

Additional circuitry includes muxes 370, muxes 390, and lines 382. Relative to the mux levels of first and second 4LUT circuitry, muxes 370 and 390 are interposed between a second and third mux level. Outputs of muxes 330 are respectively coupled to respective first inputs (labeled "0") of muxes 370 via respective lines 331 and to respective first inputs of muxes 390 via respective lines 382 as shown. Outputs of muxes 350 are respectively coupled to respective second inputs (labeled "1") of muxes 390 via respective lines 351 and to respective second inputs of muxes 370 via respective lines 382 as shown. Outputs of muxes 370 are respectively coupled to a respective input of mux 320 via respective lines 371 and outputs of muxes 390 are respectively coupled to a respective input of mux 340 via respective lines 391 as shown.

Control inputs of muxes 370 are coupled to a first additional input 305. Control inputs of muxes 390 are coupled to a second additional input 315.

Further additional circuitry includes muxes 335, 355, 375, and 395. The output of mux 335 is coupled to logic input 304 as shown. Mux 335 also includes inputs 304a and 304b which are coupled to receive, respectively, signals A1 and B2. The output of mux 355 is coupled to logic input 314 as shown. Mux 355 also includes inputs 314a and 314b which are coupled to receive, respectively, signals A2 and B1.

The output of mux 375 is coupled to logic input 305. Mux 375 also includes inputs 305a and 305b. Input 305a is coupled to receive signal A1. Input 305b is coupled to ground (i.e. a ground voltage or any voltage whose value is appropriate for implementing selection of first inputs—labeled "0"—of muxes 370) as indicated by the downwardly pointing arrow. Because one of mux 375's inputs is coupled to ground, it and similar muxes will be referred to herein occasionally as "low tie-off" muxes. The output of mux 395 is coupled to logic input 315. Mux 395 also includes inputs 315a and 315b. Input 315a is coupled to receive signal A2. Input 315b is coupled to Vcc (i.e. a supply voltage or any voltage whose value is appropriate for implementing selection of second inputs—labeled "1"—of muxes 390). Because one of mux 395's inputs is coupled to Vcc, it and similar muxes will be referred to occasionally herein as "high tie-off" muxes. In an alternative embodiment, first and second tie-off muxes might have inputs that are tied to dynamic values rather than directly to Vcc and ground. In such an alternative, these values may be dynamically set to desired values.

Logic circuitry 300 may be configured to operate in either a 4LUT ("nLUT") mode or a 5LUT ("(n+1)LUT") mode as follows:

4LUT mode ("nLUT")  (i)

To operate logic circuit 300 in 4LUT mode, mux 375 is programmed to select input 305b which is coupled to ground; mux 395 is programmed to select input 315b which is coupled to Vcc; mux 335 is programmed to select input 304a which receives signal A1; and mux 355 is programmed to select input 314a which receives signal A2 (respective control inputs coupled to respective memory elements used for programming muxes 375, 395, 335, and 355 not separately shown). In this mode, because input 305 is tied to ground and input 315 is tied to Vcc, muxes 370 all select their first inputs (labeled "0") and muxes 390 all select their second inputs (labeled "1"). In this mode, signals from lines 331 are passed to lines 371 and signals from lines 351 are passed to lines 391, effectively reducing circuitry 300 to the functionality of two independent 4LUT circuits. In particular, in this mode, signal Y1 is a function of input signals A1, B1, C1, and D1 and signal Y2 is a function of input signals A2, B2, C2, and D2. The programming of memory elements 309 determines the particular function that Y1 is of the input signals A1, B1, C1, and D1; and the programming of memory elements 319 determines the particular function that Y2 is of A2, B2, C2, and D2. Thus, two distinct four-input functions may be provided.

5LUT mode ("(n+1)LUT")  (ii)

To operate circuit 300 in the 5LUT mode, mux 375 is programmed to select input 305a which receives signal A1; mux 335 is programmed to select input 304b which receives signal B2; mux 395 is programmed to select input 315a which receives signal A2; and mux 355 is programmed to select input 314b which receives signal B1. In this mode, logic inputs 303 and 314 both receive the same signal B1 and inputs 304 and 313 both receive the same signal B2. Thus, in this mode, circuitry 300 provides functionality similar to that of circuitry 200 in that circuitry 300 in 5LUT mode provides the functionality of two 5LUT circuits that may be configured to provide the same functions of five inputs, two of the inputs being shared across the two 5LUT circuits. In particular, in this mode, signal Y1 is a function of input signals B2, B1, A1, C1, and D1 and signal Y2 is a function of input signals B1, B2, A2, C2, and D2. The particular function implemented depends upon the programming of memory elements 309 and 319.

FIG. 4 illustrates logic circuit 400 in accordance with another embodiment of the present invention. Circuit 400 includes the circuitry of two 4LUT circuits and additional circuitry including a plurality of muxes interposed between two mux levels of the 4LUT circuits and coupled so that some of the circuitry of the two 4LUT circuits is shared in logic circuit 400. Additional logic inputs are provided coupled to control inputs of the interposed muxes. Furthermore, additional muxes coupled with certain of the logic inputs allow logic circuitry 400 to provide, depending on configuration, functionality of: (i) two 4LUT circuits which may or may not implement the same function; (ii) two 5LUT circuits which implement the same function; or (iii) two 6LUT circuits which may implement certain functions of six inputs. These aspects will now be described in further detail.

First 4LUT circuitry includes memory elements 409, muxes 430, lines 431 and 471, and mux 420. Control inputs of mux 420 are coupled to, respectively, first and second inputs 401 and 402. Control inputs of muxes 430 are coupled to, respectively, third and fourth inputs 403 and 404. The output of mux 420 is coupled to provide output signal Y1 at output 425.

Second 4LUT circuitry includes memory elements 419, muxes 450, lines 451 and 491, and mux 440. Control inputs of mux 440 are coupled to, respectively, first and second inputs 411 and 412. Control inputs of muxes 450 are coupled to, respectively, third and fourth inputs 413 and 414. The output of mux 440 is coupled to provide output 445.

Relative to output 425, input 402 may be said to be coupled to control inputs of muxes at a second mux level of first 4LUT circuitry. Input 403 may be said to be coupled to control inputs of muxes at a third mux level of first 4LUT circuitry. Similarly, relative to output 445, input 412 may be said to be coupled to control inputs of muxes at a second mux level of second 4LUT circuitry. Input 413 may be said to be coupled to control inputs of muxes at a third mux level of second 4LUT circuitry.

Additional circuitry includes muxes 470-1 and 470-2, muxes 490-1 and 490-2, and lines 482. Relative to the mux levels of first and second 4LUT circuitry, muxes 470-1 and 470-2 and muxes 490-1 and 490-2 are interposed between a second and third mux level. Outputs of muxes 430 are respectively coupled to respective first inputs (labeled "0") of muxes 470-1 or 470-2 via respective lines 431 and to respective first inputs of muxes 490-1 or 490-2 via respective lines 482 as shown. Outputs of muxes 450 are respectively coupled to respective second inputs (labeled "1") of muxes 490-1 or 490-2 via respective lines 451 and to respective second inputs of muxes 470-1 or 470-2 via respective lines 482 as shown. Outputs of muxes 470-1 and 470-2 are coupled to inputs of mux 420 via lines 471 and outputs of muxes 490-1 and 490-2 are coupled to inputs of mux 440 via lines 491 as shown.

Further additional circuitry includes muxes 435, 475, 465, 455, 495, and 485. Control inputs of muxes 470-1 and 470-2 are coupled to an output of, respectively, low tie-off mux 475 and mux 465. Control inputs of muxes 490-1 and 490-2 are coupled to an output of, respectively, high tie-off mux 495 and mux 485.

A first additional logic input 405 is coupled to input 405-1*a* of mux 475 and to input 405-2*b* of mux 465. A second additional logic input 415 is coupled to input 415-1*a* of mux 495 and to input 415-2*b* of mux 485. A memory element "R" is coupled to input 405-2*a* of mux 465 and to inverting input 415-2*a* of mux 485. Memory element R holds a value relevant to the configuration of modes of circuit 400 as will be further described. For labeling convenience only, the value in memory element R will be referred to as a "set" value. Input 405-1*b* of mux 475 is coupled to ground and input 415-1*b* of mux 495 is coupled to Vcc.

Three different modes of logic circuit 400 may be implemented depending upon the programming of muxes 435, 455, 475, 495, 465, and 485 as will now be described in further detail.

4LUT mode ("nLUT")        (i)

In 4LUT mode, mux 475 is programmed to select input 405-1*b* which is coupled to ground. Mux 495 is programmed to select input 415-1*b* which is coupled to Vcc. Mux 465 is programmed to select input 405-2*a* which is coupled to memory element R. Mux 485 is programmed to select inverting input 415-2*a* which is also coupled to memory element R. In this mode, memory element R's set value is low. Muxes 470-1 and muxes 470-2 thus receive low control signals from the output of, respectively, mux 475 and mux 465. Thus the first inputs (labeled "0") of muxes 470-1 and muxes 470-2 are selected. Conversely, muxes 490-1 and 490-2 received high control signals from the output of, respectively, mux 495 and mux 485 (note that mux 485 has selected a high value because the low value provided by memory element R is inverted at input 415-2*a*). Thus the second inputs (labeled "1") of muxes 490-1 and muxes 490-2 are selected. Mux 435 is programmed to select input 404*b* which receives signal B1 and mux 455 is programmed to select input 414*b* which receives signal B2.

In this mode, signal Y1 is a function of input signals B1, A1, C1, and D1 and signal Y2 is a function of input signals B2, A2, C2, and D2. Thus, the functionality of two 4LUT circuits is provided. As with the 4LUT mode operation described for logic circuit 300 (see FIG. 3 and accompanying text), in the 4LUT mode for logic circuit 400, two different functions of the respective 4LUT circuits may be programmed. The function relating Y1 to B1, A1, C1, and D1 is determined by the data in memory elements 409 and the function relating Y2 to B2, A2, C2, and D2 is determined by the data in memory elements 419.

5LUT mode ("(n+1)LUT")        (ii)

In 5LUT mode, mux 475 is programmed to select input 405-1*a* which receives signal B1. Mux 495 is programmed to select input 415-1*a* which receives signal B2. Mux 465 is programmed to select input 405-2*b* which receives signal B1. Mux 485 is programmed to select inverting input 415-2*b* which receives signal B2. Mux 435 is programmed to select input 404*a* which receives signal A2 and mux 455 is programmed to select input 414*a* which receives signal A1.

As with the 5LUT mode operation described for logic circuit 300 (see FIG. 3 and accompanying text), the 5LUT mode for logic circuit 400 provides the functionality of two 5LUT circuits that may be configured to provide the same functions of five inputs, two of the inputs being shared across the two 5LUT circuits (logic inputs 403 and 414 both receive signal A1 and logic inputs 404 and 413 both receive signal A2). In particular, in this mode, signal Y1 is a function of input signals A2, A1, B1, C1, and D1 and signal Y2 is a function of input signals A2, A1, B2, C2, and D2. The particular function implemented depends upon the programming of memory elements 409 and 419.

6LUT mode ("(n+2)LUT")        (iii)

In 6LUT mode, mux 475 is programmed to select input 405-1*b* which is coupled to ground. Muxes 470-1 thus receive low control signals from the output of mux 475 and therefore first inputs (labeled "0") of muxes 470-1 are selected. Mux 495 is programmed to select input 415-1*b* which is coupled to Vcc. Muxes 490-1 thus receive high control signals from the output of mux 495 and therefore second inputs (labeled "1") of muxes 490-1 are selected. Mux 465 is programmed to select input 405-2*a* which is coupled to memory element R. Mux 485 is programmed to select inverting input 415-2*a* which is also coupled to memory element R. In this mode, memory element R's set value is high. Muxes 470-2 thus receive high control signals from the output of mux 465. Thus the second inputs (labeled "1") of muxes 470-2 are selected. Conversely, muxes 490-2 received low control signals from the output of mux 485 (note that mux 485 has selected a low value because the high value provided by memory element R is inverted at input 415-2*a*). Thus the first inputs (labeled "0") of muxes 490-2 are selected. Mux 435 is programmed to select input 404*b* which receives signal B1 and mux 455 is programmed to select input 414*b* which receives signal B2.

In this mode, incomplete functionality of two 6LUT circuits is provided. Y1 is an incomplete function of input signals B1, A1, C1, D1, B2 and A2 and Y2 is an incomplete function of input signals B2, A2, C2, D2, B1, and A1. In other words, some but not all functions of six inputs can be implemented. For example, the following statements illustrate relationships that can be implemented:

Y1=D1&F(A1, B1, C1)#!D1&F'(A2, B2, C1)

Y2=D2&G(A2, B2, C2)#!D2&G'(A1, B1, C2)

(where F, F', G, and G' represent arbitrary functions as programmed by bits in memory elements 409 and 419; and "&", "#", and "!" represent, respectively, the logical operators "AND", "OR", and "NOT").

The two n+2-input incomplete functions implemented in this example do not need to be the same. However, the functions do have some of the same inputs. Thus the implementation of an incomplete function for Y1 will limit the set of incomplete functions that could otherwise be implemented for Y2, and vice-versa. In this sense, the functions may be said to be "related."

In each of the embodiments shown in FIGS. 2–4, the interposed muxes are placed between two middle levels of the mux trees of corresponding first and second nLUT circuitry. When the value of n is even, interposed muxes may be said to be placed at a middle level of a mux tree of first and second nLUT circuitry when they are placed between an x and x+1 mux level and the value of x is such that 2x=n. When the value of n is odd, interposed muxes may be said to be placed at such a middle level when the value of x is such that either 2x+1 or 2x−1 is equal to n. As the interposed muxes are moved closer to the logic outputs, greater savings in circuit area is obtained as more mux circuitry is shared; however, as more inputs are shared, less flexibility may result. Thus, placing the interposed muxes at or near the middle level of first and second nLUT circuitry offers a tradeoff between flexibility and savings in circuit area that may be optimum for many applications. However, as will be shown and described in FIGS. 5–6 and accompany text, alternative embodiments of the present invention do not necessarily have interposed mux trees that are interposed between middle levels of first and second nLUT circuitry.

Figure 5:
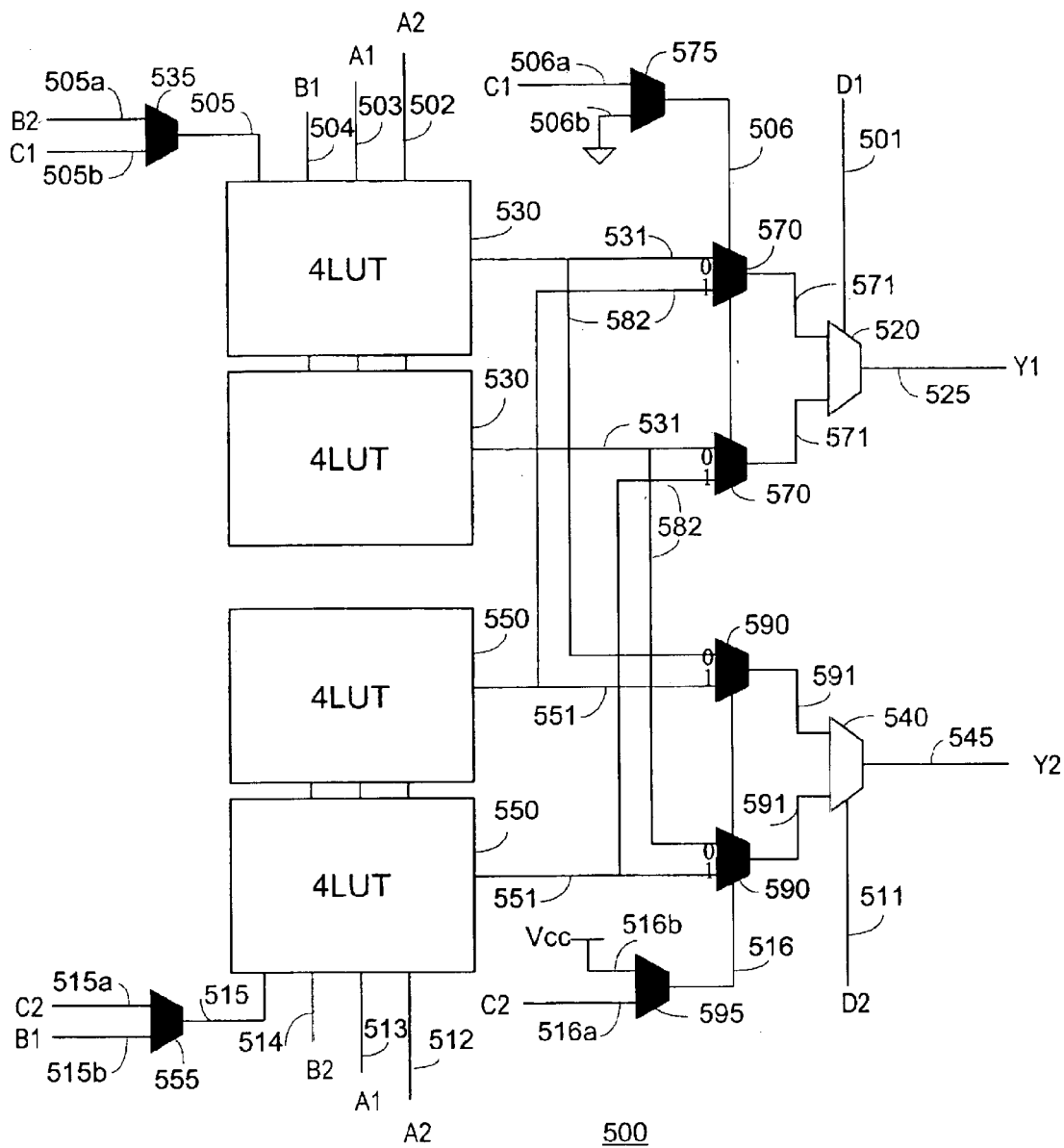
FIG. 5 illustrates first and second 5LUT logic circuitry coupled by interposed muxes and including other additional muxes that may be programmed to selectively provide: (i) two 5LUT logic circuits (ii) two 4LUT logic circuits or (iii) two 6LUT logic circuits in accordance with another embodiment of the present invention.

FIG. 5 illustrates logic circuit 500 in accordance with another embodiment of the present invention. As will be described, logic circuit 500 is similar to logic circuit 300 (see FIG. 3 and accompanying text) except that logic circuit 500 combines two 5LUT circuits (instead of two 4LUT circuits) and a plurality of muxes is interposed between a first and second mux level (instead of between a second and third mux level). Logic circuit 500 provides, depending on configuration, functionality of either two 5LUT circuits which may or may not implement the same function, or two 6LUT circuits which implement the same function. As another alternative, logic circuit 500 may be configured to implement the functionality of two 4LUT circuits. These aspects will now be described in further detail.

First 5LUT circuitry includes 4LUTs 530 lines 531 and 571 and mux 520. Note that FIG. 5 just shows 4LUTs 530 as single "4LUT" blocks to avoid overcomplicating the drawing. As will be appreciated by those skilled in the art, 4LUTs 530 include memory elements and muxes not separately shown that are coupled together to provide 4LUT circuits comparable to the 4LUT circuit 100-1 or 100-2 of FIG. 1. The control input of mux 520 is coupled to first input 501. Control inputs of muxes in respective mux levels within each 4LUT 530 (muxes internal to 4LUTs 530 not separately shown) are coupled to respective second, third, fourth and fifth inputs 502, 503, 504, and 505. The output of mux 520 is coupled to provide output signal Y1 at output 525.

Second 5LUT circuitry includes 4LUTs 550 (memory elements and muxes coupled together to provide 4LUT circuits 550 not separately shown) lines 551 and 591 and mux 540. The control input of mux 540 s coupled to first input 511. Control inputs of muxes in respective mux levels within each 4LUT 550 (muxes internal to 4LUTs 530 not separately shown) are coupled to respective second, third, fourth and fifth inputs 512, 513, 514, and 515. The output of mux 540 is coupled to provide output signal Y2 at output 545.

Relative to output 525, input 501 may be said to be coupled to a control input of a mux at a first mux level of first 5LUT circuitry (note, in this instance, the first level comprises just one 2:1 mux). Input 502 may be said to be coupled to control inputs of muxes at a second mux level of first 5LUT circuitry (note, in this instance, the second level would comprise two 2:1 muxes: one 2:1 mux internal to each 4LUT 530—muxes internal to 4LUTs 530 not separately shown). Similarly, relative to output 545, input 511 may be said to be coupled to a control input of a mux at a first mux level of second 5LUT circuitry. Input 512 may be said to be coupled to control inputs of muxes at a second mux level of second 5LUT circuitry.

Additional circuitry includes muxes 570, muxes 590, and lines 582. Relative to the mux levels of first and second 5LUT circuitry, muxes 570 and 590 are interposed between a first and second mux level (more generally, between an "x" and "x+1" level). Outputs of 4LUTs 530 are respectively coupled to respective first inputs (labeled "0") of muxes 570 via respective lines 531 and to respective first inputs of muxes 590 via respective lines 582 as shown. Outputs of 4LUTs 550 are respectively coupled to respective second inputs (labeled "1") of muxes 590 via respective lines 551 and to respective second inputs of muxes 570 via respective lines 582 as shown. Outputs of muxes 570 are coupled to inputs of mux 520 via lines 571 and outputs of muxes 590 coupled to inputs of mux 540 via lines 591 as shown.

Control inputs of muxes 570 are coupled to a first additional input 506. Control inputs of muxes 590 are coupled to a second additional input 516. More generally, additional inputs 506 and 516 may be said to be "n+1th" inputs of respective (n+1)LUT circuitry provided by logic circuit 500.

Further additional circuitry includes muxes 535, 555, 575, and 595. The output of mux 535 is coupled to logic input 505 as shown. Mux 535 also includes inputs 505a and 505b which are coupled to receive, respectively, signals B2 and C1. The output of mux 555 is coupled to logic input 515 as shown. Mux 555 also includes inputs 515a and 515b which are coupled to receive, respectively, signals C2 and B1.

The output of low tie-off mux 575 is coupled to logic input 506. Mux 575 also includes inputs 506a and 506b. Input 506a is coupled to receive signal C1. Input 506b is coupled to ground as indicated by the downwardly pointing arrow. The output of high tie-off mux 595 is coupled to logic input 516. Mux 595 also includes inputs 516a and 516b. Input 516a is coupled to receive signal C2. Input 516b is coupled to Vcc.

Logic circuit 500 may be configured to operate in either a 5LUT ("nLUT") mode, a 4LUT ("(n−1)LUT"), or a 6LUT ("(n+1)LUT") mode as follows:

5LUT mode ("nLUT") (i)

To operate logic circuitry 500 in 5LUT mode, mux 575 is programmed to select input 506b which is coupled to ground; mux 595 is programmed to select input 516b which is coupled to Vcc; mux 535 is programmed to select input 505b which receives signal C1; and mux 555 is programmed to select input 515a which receives signal C2. In this mode, because input 506 is tied to ground and input 516 is tied to Vcc, muxes 570 all select their first inputs (labeled "0") and muxes 590 all select their second inputs (labeled "1"). In this mode, signals from lines 531 are passed to lines 571 and signals from lines 551 are passed to lines 591, effectively reducing circuitry 500 to the functionality of two independent 5LUT circuits with two inputs being shared across the two halves of circuit 500 (inputs 503 and 513 both receive signal A1 and inputs 502 and 512 both receive signal A2). In particular, in this mode, signal Y1 is a function of input signals C1, B1, A1, A2, and D1 and signal Y2 is a function of input signals C2, B2, A1, A2 and D2. The programming of memory elements 509 determines the particular function that Y1 is of the input signals C1, B1, A1, A2, and D1; and the programming of memory elements 319 determines the particular function that Y2 is of C2, B2, A1, A2 and D2. Thus, two distinct five-input functions may be provided.

4LUT mode ("(n−1)LUT") (ii)

To operate logic circuitry 500 in 4LUT mode, muxes 575, 595, 535 and 555 are programmed the same as just described above for 5LUT mode. As will be appreciated by those skilled in the art, memory elements in 4LUTs 530 and 4LUTs 550 (memory elements not separately shown) may be programmed to ignore one input for each half of circuitry 500. For example, memory elements in 4LUTs 530 may be programmed so that input signal A1 at input 503 is effectively ignored (i.e., the value of A1 would not affect the value of output signal Y1). Similarly, memory elements in 4LUTs 550 may be programmed so that input signal A2 at input 512 is also effectively ignored. In such an example, signal Y1 would then be a function of C1, B1, A2, and D1 and Y2 would be a function of C2, B2, A1, and D2. Thus, in this example, the functionality of two independent 4LUT circuits would be provided and no shared inputs would be required. As will be appreciated by those skilled in the art, in an alternative modification in which A2 were ignored at input 502 instead of A1 being ignored at input 503, then one shared input (503 and 513 coupled together) would exist for the two independent 4LUT functions.

6LUT mode ("(n+1)LUT")  (iii)

To operate circuitry 500 in the 6LUT mode, mux 575 is programmed to select input 506a which receives signal C1; mux 535 is programmed to select input 505a which receives signal B2; mux 595 is programmed to select input 516a which receives signal C2; and mux 555 is programmed to select input 515b which receives signal B1. In this mode, four inputs are shared across the two halves of the circuitry 500: inputs 505 and 514 both receive the same signal B2; inputs 504 and 515 both receive the same signal B1; inputs 503 and 513 both receive the same signal A1, and inputs 502 and 512 both receive the same signal A2. Thus, in this mode, circuitry 500 provides the functionality of two 6LUT circuits that may be configured to provide the same functions of six inputs, four of the inputs being shared across the two 6LUT circuits. In particular, in this mode, signal Y1 is a function of input signals B2, B1, A1, A2, C1, and D1 and signal Y2 is a function of input signals B1, B2, A1, A2, C2, and D2. The particular function implemented depends upon the programming of memory elements 509 and 519.

Figure 6:
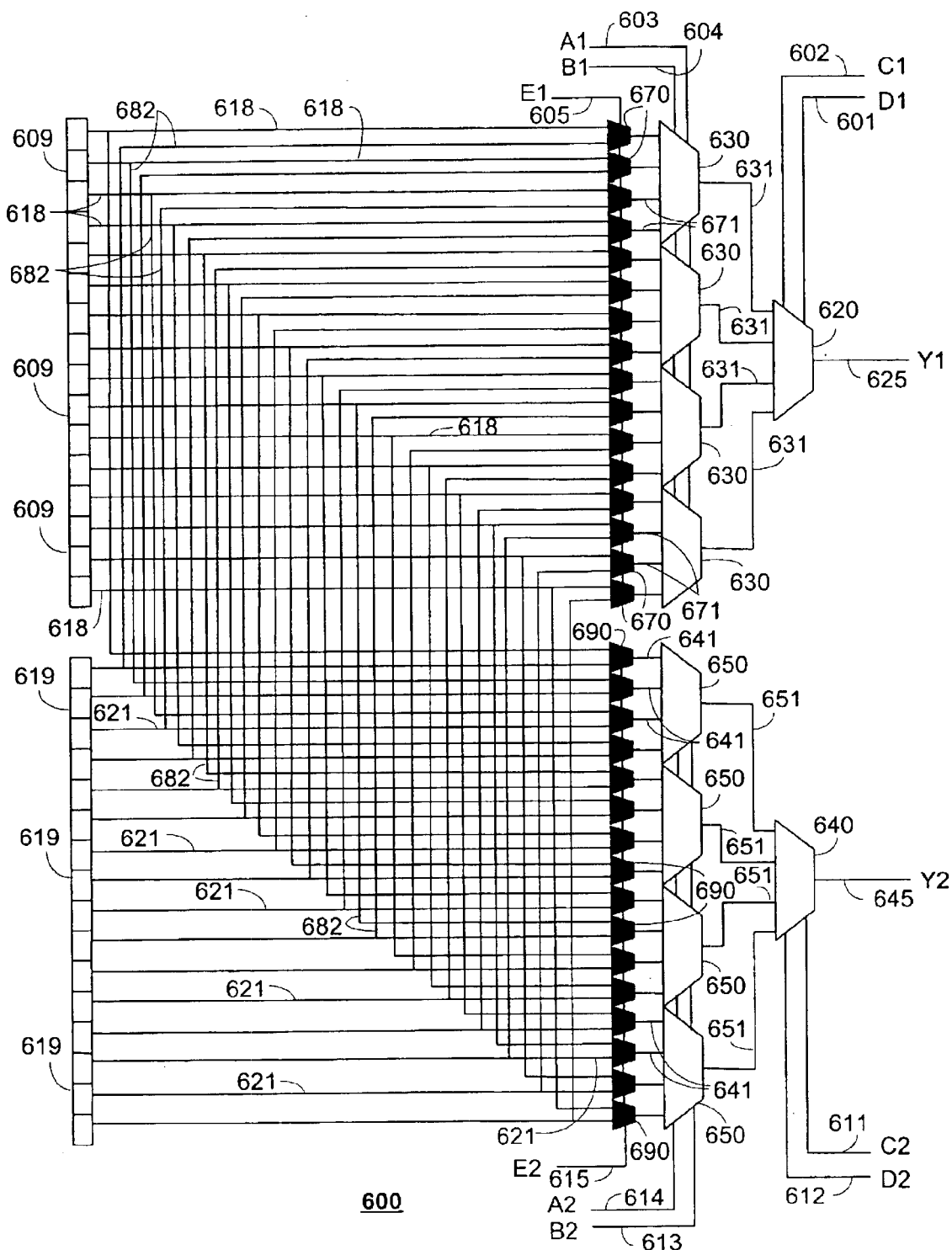
FIG. 6 illustrates first and second 4LUT logic circuitry coupled by interposed muxes to provide two 5LUT logic circuits in accordance with another embodiment of the present invention.

FIG. 6 illustrates logic circuitry 600 in accordance with another embodiment of the present invention. Circuitry 600 includes the circuitry of two 4LUT circuits plus additional circuitry including a plurality of muxes interposed between a last mux level and memory elements of the 4LUT circuits and coupled so that some of the circuitry of the two 4LUT circuits is shared in logic circuitry 600. Additional logic inputs are provided coupled to control inputs of the interposed muxes as will now be described.

First 4LUT circuitry includes memory elements 609, lines 618, lines 671 muxes 630, lines 631 and mux 620. Control inputs of mux 620 are coupled to, respectively, first and second inputs 601 and 602. Control inputs of muxes 630 are coupled to third and fourth inputs 603 and 604. The output of mux 620 is coupled to provide output signal Y1 at output 625.

Second 4LUT circuitry includes memory elements 619, lines 621, lines 641, muxes 650, lines 651, and mux 640. Control inputs of mux 640 are coupled to, respectively, first and second inputs 611 and 612. Control inputs of muxes 650 are coupled to, respectively, third and fourth inputs 613 and 614. The output of mux 640 is coupled to provide output 645.

Relative to output 625 and memory elements 609, input 604 may be said to be coupled to control inputs of muxes at a last level of a mux tree of first 4LUT circuitry (i.e. the level of 2:1 muxes whose inputs would be connected directly to LUT memory elements 609 absent interposed muxes 670). Similarly, relative to output 645 and memory elements 619, input 614 may be said to be coupled to control inputs of muxes at a last mux level of second 4LUT circuitry.

Additional circuitry includes muxes 670, muxes 690, and lines 682. Relative to the mux levels of first and second 4LUT circuitry, muxes 670 and 690 are interposed between a last mux level and LUT memory elements. Memory elements 609 are respectively coupled to first inputs of muxes 670 via respective lines 618 and to first inputs of muxes 690 via lines 682. Similarly, memory elements 619 are respectively coupled to second inputs of muxes 690 via respective lines 621 and to second inputs of mux 670 via respective lines 682. Outputs of muxes 670 are coupled to inputs of muxes 630 via lines 671 and outputs of muxes 690 are coupled to inputs of muxes 650 via lines 641 as shown.

Control inputs of muxes 670 are coupled to a first additional input 605. Control inputs of muxes 690 are coupled to a second additional input 615.

In the embodiment illustrated in FIG. 6, signals D1, C1, A1, B1, and E1 are received at, respectively, inputs 601, 602, 603, 604, and 605. Similarly, C2, D2, B2, A2, and E2 are received at, respectively, inputs 611, 612, 613, 614, and 615. In the illustrated embodiment, logic circuitry 600 provides the functional equivalent of two 5LUT logic circuits. A first 5LUT circuit provides signal Y1 which is a function of input signals A1, B1, C1, D1, and E1. A second 5LUT circuit provides signal Y2 which is a function of input signals A2, B2, C2, D2, and E2. The five-input functions implemented by logic circuitry may be reconfigured by loading different bits into memory elements 609 and memory elements 619. In this embodiment, each 5LUT implements the same logical function of the five indicated input signals.

Figure 7:
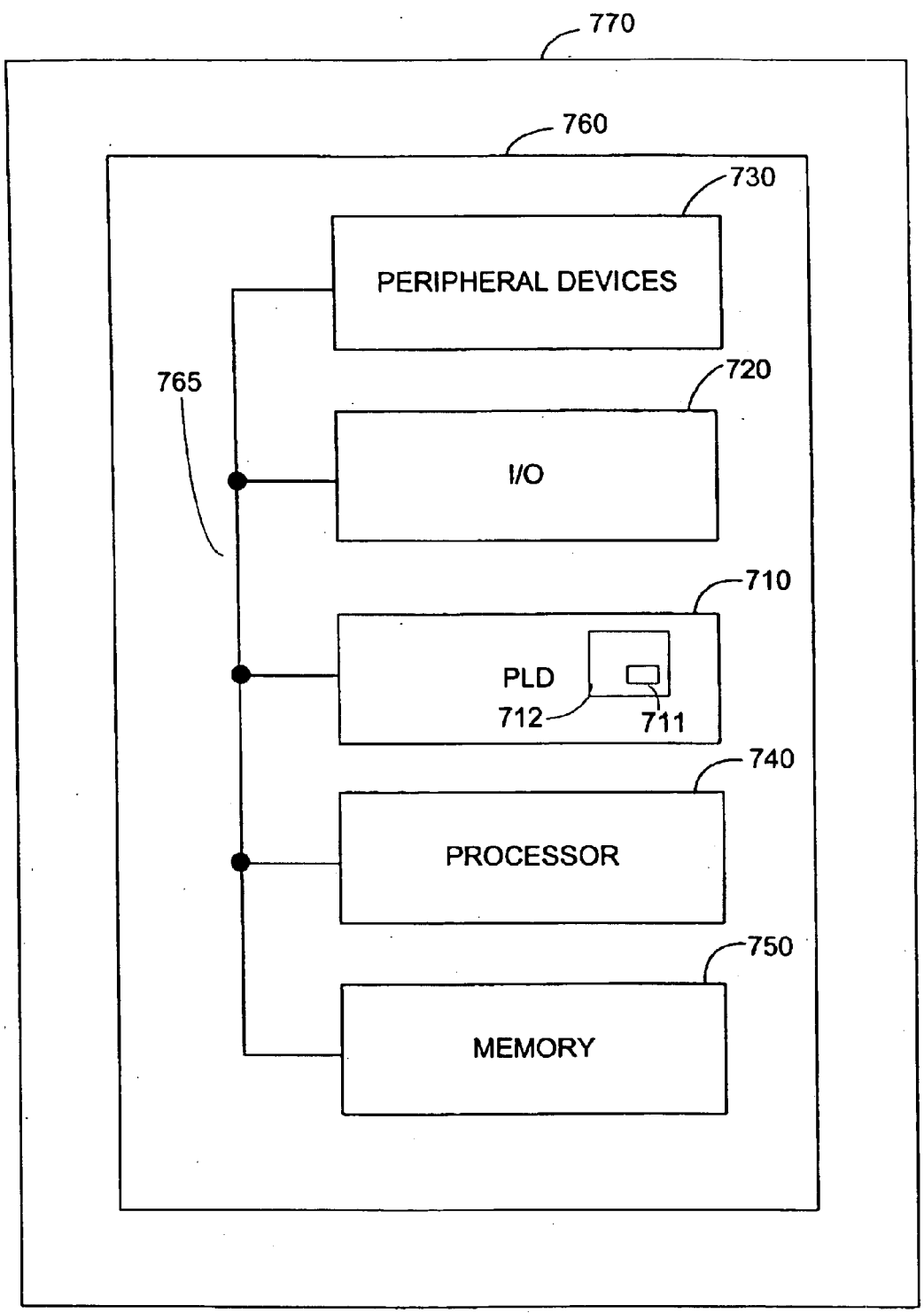
FIG. 7 illustrates an exemplary data processing system including an exemplary programmable logic device in which logic circuits in accordance with the present invention might be implemented.

FIG. 7 illustrates a programmable logic device (PLD) 710 in a data processing system 700. As one example, logic circuits of this invention may be implemented in logic elements of PLDs such as PLD 710. PLD 710 includes a plurality of logic array blocks (LABs) such as LAB 712 (only one LAB is shown to avoid overcomplicating the drawing). LAB 712 includes a plurality of logic elements such as logic element 711 (only one logic element is shown to avoid overcomplicating the drawing). Data processing system 700 may include one or more of the following components: a processor 740; memory 750; I/O circuitry 720; and peripheral devices 730. These components are coupled together by a system bus 765 and are populated on a circuit board 760 which is contained in an end-user system 770.

System 700 can be used in a wide variety of applications, such as computer networking, data networking, instrumentation, video processing, digital signal processing, or any other application where the advantage of using programmable or reprogrammable logic is desirable. PLD 710 can be used to perform a variety of different logic functions. For example, programmable logic device 710 can be configured as a processor or controller that works in cooperation with processor 740 (or, in alternative embodiments, a PLD might itself act as the sole system processor). PLD 710 may also be used as an arbiter for arbitrating access to a shared resources in system 700. In yet another example, PLD 710 can be configured as an interface between processor 740 and one of the other components in system 700. It should be noted that system 700 is only exemplary.

Although particular embodiments have been described in detail, various modifications to the embodiments described herein may be made without departing from the spirit and scope of the present invention, thus, the invention is limited only by the appended claims.

I claim:

1. A logic circuit comprising:
   first n-input LUT circuitry;
   second n-input LUT circuitry; and
   a plurality of muxes interposed between an x and an x+1 mux level of the first and second n-input LUT circuitry, each mux of the plurality of interposed muxes including:
      a first input coupled to an output of an x+1 level mux of the first n-input LUT circuitry;
      a second input coupled to an output of an x+1 level mux of the second n-input LUT circuitry; and
      an output coupled to an input of an x level mux of the first or second n-input LUT circuitry.

2. The logic circuit of claim 1 wherein:
   the logic circuit provides first and second n+1-input LUT circuits;
   control inputs of the plurality of interposed muxes are coupled to an n+1'th logic input the first n+1-input LUT circuit or to an n+1'th logic input of the second n+1-input LUT circuit; and
   at least one input of the first n+1-input LUT circuit is coupled to receive the same signal as at least one input of the second n+1-input LUT circuit.

3. The logic circuit of claim 2 further comprising:
   a first additional mux including a first input coupled to receive a first input signal, a second input coupled to receive a second input signal, and an output coupled to provide either the first or second input signal to an input of the first n+1-input LUT circuit;
   a second additional mux including a first input coupled to receive a first input signal, a second input coupled to receive a second input signal, and an output coupled to provide either the first or second input signal received by the second additional mux to an input of the second n+1-input LUT circuit;
   a first tie-off mux including a first input coupled to receive an input signal, a second input coupled to receive a first tie-off value, and an output coupled to provide either the input signal or the first tie-off value to muxes of the plurality of interposed muxes; and
   a second tie-off mux including a first input coupled to receive an input signal, a second input coupled to receive a second tie-off value, and an output coupled to provide either the input signal or the second tie-off value to muxes of the plurality of interposed muxes.

4. The logic circuit of claim 3 wherein:
   the first additional mux, the second additional mux, the first tie-off mux, and the second tie-off mux are configurable so that the logic circuit can provide either two n-input LUT circuits having independently programmable functions or two n+1-input LUT circuits having the same programmable functions.

5. The logic circuit of claim 3 wherein at least one of the first and second tie-off values is dynamic.

6. The logic circuit of claim 3 wherein at least one of the first and second tie-off values is fixed.

7. The logic circuit of claim 3 wherein the first tie-off value is low and the second tie-off value is high.

8. The logic circuit of claim 3 wherein the first input of the first tie-off mux is coupled to receive the same input signal as one of the inputs of the first additional mux and the first input of the second tie-off mux is coupled to receive the same input signal as one of the inputs of the second additional mux.

9. The logic circuit of claim 3 further comprising:
   a third additional mux including a first input coupled to a memory element providing a set value, a second input coupled to receive the same input signal received by the first input of the first tie-off mux, and an output coupled to control inputs of muxes of the plurality of muxes; and
   a fourth additional mux including an inverting input coupled to the memory element to receive the set value and provide an inverted set value to the fourth additional mux, the fourth additional mux also including another input coupled to receive the same signal as the first input of the second tie-off mux and an output coupled to control inputs of muxes of the plurality of muxes.

10. The logic circuit of claim 9 wherein:
    the first additional mux, the second additional mux, the third additional mux, the fourth additional mux, the memory element, the second tie-off mux, and the first tie-off mux are configurable so that the logic circuit can provide either two n-input LUT circuits having independently programmable functions, two n+1-input LUT circuits having the same programmable functions, or two n+2-input LUT circuits having incomplete programmable functions.

11. The logic circuit of claim 1 wherein the value of n is even and the value of x is such that 2x=n.

12. The logic circuit of claim 1 wherein the value of n is odd and the value of x is such that either 2x+1 or 2x−1 is equal to n.

13. The logic circuit of claim 2 wherein:
    the plurality of interposed muxes includes a first plurality of interposed muxes and a second plurality of interposed muxes;
    outputs of the first plurality of interposed muxes being coupled an input of an x level mux of the first n-input LUT circuitry and control inputs of the first plurality of interposed muxes being coupled to the n+1'th input of the first n+1-input LUT circuit; and
    outputs of the second plurality of interposed muxes being coupled to an input of an x level mux of the n-input LUT circuitry and control inputs of the second plurality of interposed muxes being coupled to the n+1'th input of the second n+1-input LUT circuit.

14. A programmable logic device comprising the logic circuit of claim 1.

15. A data processing system comprising the programmable logic device of claim 14.

16. A programmable logic device comprising the logic circuit of claim 3.

17. A data processing system comprising the programmable logic device of claim 16.

18. A programmable logic device comprising the logic circuit of claim 9.

19. A data processing system comprising the programmable logic device of claim 18.

20. A logic circuit comprising:
    first n-input LUT circuitry;
    second n-input LUT circuitry; and
    a plurality of muxes interposed between a last mux level and memory elements of the first and second n-input LUT circuitry, each mux of the plurality of interposed muxes including:

a first input coupled to a memory element of the first n-input LUT circuitry;

a second input coupled to a memory element of the second n-input LUT circuitry; and an output coupled to an input of a last-level mux of the first or second n-input LUT circuitry.

21. The logic circuit claim 20 wherein the logic circuit provides first and second n+1-input LUT circuits, control inputs of the plurality of interposed muxes being coupled to an n+1'th logic input the first n+1-input LUT circuit or to an n+1'th logic input of the second n+1-input LUT circuit.

22. The logic circuit of claim 21 wherein:

the plurality of interposed muxes includes a first plurality of interposed muxes and a second plurality of interposed muxes;

outputs of the first plurality of interposed muxes being coupled to an input of a last-level mux of the first n-input LUT circuitry and control inputs of the first plurality of interposed muxes being coupled to the n+1'th input of the first n+1-input LUT circuit; and outputs of the second plurality of interposed muxes being coupled to an input of a last-level mux of the second n-input LUT circuitry and control inputs of the second plurality of interposed muxes being coupled to the n+1'th input of the second n+1-input LUT circuit.

23. A programmable logic device comprising the logic circuit of claim 20.

24. A data processing system comprising the programmable logic device of claim 23.

25. A logic circuit comprising:

first n-input LUT means;

second n-input LUT means; and a plurality of selection means interposed between selection levels of the first and second n-input LUT means, the plurality of selection means coupling the first n-input LUT means with the second n-input LUT means such that the logic circuit provides two n+1-input LUT means for implementing two related n+1-input logic functions.

26. The logic circuit of claim 25 further comprising:

a plurality of selection means coupled to inputs of the logic circuit for implementing and providing selection such that the logic circuit provides either two n+1-input LUT means for implementing two n-input logic functions that are the same or two n-input LUT means for implementing two independent n-input logic functions.

27. The logic circuit of claim 26 further comprising:

an additional plurality of selection means coupled to the logic circuit for implementing and providing further such that the logic circuit may also provide two n+2-input LUT means for implementing two incomplete and related n+2-input functions.

28. A programmable logic device comprising the logic circuit of claim 25.

29. A data processing system comprising the programmable logic device of claim 28.

30. A programmable logic device comprising the logic circuit of claim 26.

31. A data processing system comprising the programmable logic device of claim 30.

32. A programmable logic device comprising the logic circuit of claim 27.

33. A data processing system comprising the programmable logic device of claim 32.

34. A look-up table (LUT) based logic element (LE), comprising:

m data inputs;

two data outputs;

2k bits of LUT mask, wherein the LE includes first and second circuitry configured to accomplish first and second respective identical Boolean functions, each of the first and second circuitry operating on k data inputs responsive to a separate 2k−1 bits of the 2k bits of LUT mask, wherein 2k−m inputs of the m inputs are shared between the first and second circuitry and m−k inputs of each k inputs are independent inputs.

35. The LE of claim 34, wherein:

m=k+2;

each of the first and second circuitry includes base circuitry comprising a plurality of multiplexor stages to nominally accomplish a k−1 LUT function operating responsive to the separate 2k−1 bits of the 2k bits of LUT mask;

each of the first and second circuitry further includes an additional stage inserted between a first, earlier, multiplexor stage and a second, later, multiplexor stage of the base circuitry, the additional stage of each of the first and second circuitry configured to selectively pass the outputs from the earlier stage of that circuitry or from the earlier stage of the other circuitry, to the later stage of that circuitry, the first and second circuitry thereby collectively forming two k input LUT functions with no additional LUT mask bits beyond the 2k bits of LUT mask.

* * * * *